United States Patent
Wu et al.

(10) Patent No.: US 8,664,734 B2
(45) Date of Patent: Mar. 4, 2014

(54) HOLE-BASED ULTRA-DEEP PHOTODIODE IN A CMOS IMAGE SENSOR AND A PROCESS THEREOF

(75) Inventors: Yang Wu, Tainan (TW); Feixia Yu, Tainan (TW)

(73) Assignee: Himax Imaging, Inc., Grand Cayman (KY)

( * ) Notice: Subject to any disclaimer, the term of this patent is extended or adjusted under 35 U.S.C. 154(b) by 320 days.

(21) Appl. No.: 13/004,528

(22) Filed: Jan. 11, 2011

(65) Prior Publication Data

US 2012/0175691 A1     Jul. 12, 2012

(51) Int. Cl.
*H01L 31/0352*     (2006.01)

(52) U.S. Cl.
USPC ............ 257/431; 257/E31.032; 438/57

(58) Field of Classification Search
USPC .................. 257/E27.159, 431–466, 257/E31.032–E31.039; 438/57–98
See application file for complete search history.

(56) References Cited

U.S. PATENT DOCUMENTS

| | | | |
|---|---|---|---|
| 6,590,242 B1 * | 7/2003 | Kozuka et al. | 257/292 |
| 6,673,679 B1 * | 1/2004 | Miyasaka et al. | 438/268 |
| 7,385,272 B2 * | 6/2008 | Toros et al. | 257/463 |
| 2007/0018264 A1 * | 1/2007 | Rhodes et al. | 257/432 |

* cited by examiner

*Primary Examiner* — Julio J Maldonado
*Assistant Examiner* — Daniel Shook
(74) *Attorney, Agent, or Firm* — Muncy, Geissler, Olds & Lowe, P.C.

(57) ABSTRACT

A hole-based ultra-deep photodiode in a CMOS image sensor and an associated process are disclosed. A p-type substrate is grounded or connected to a negative power supply. An n-type epitaxial layer is grown on the p-type substrate, and is connected to a positive power supply. An ultra-deep p-type photodiode implant region is formed in the n-type epitaxial layer. Thermal steps are added to insure a smooth and deep doping profile.

17 Claims, 3 Drawing Sheets

HOLE-BASED ULTRA-DEEP PHOTODIODE IN A CMOS IMAGE SENSOR AND A PROCESS THEREOF

BACKGROUND OF THE INVENTION

1. Field of the Invention

The present invention generally relates to a complementary metal-oxide-semiconductor (CMOS) image sensor, and more particularly to a hole-based ultra-deep photodiode in a CMOS image sensor for automobile application.

2. Description of Related Art

CMOS image sensor (or CIS) has been widely used, for example, in a cell phone camera, a web camera, a surveillance camera, a toy or medical equipment. The CMOS image sensor can be further adopted in a severe environment such as an automobile application, in which the requirements to the image sensor are very demanding due to harsh operation conditions of the automobile. Some issues at least need be resolved to adapt the CMOS image sensor for use in the automobile application.

Firstly, a high sensitivity or signal-to-noise ratio (SNR) is crucial particularly for a night operation of the automobile, such that more detailed information can be used for decision making.

Secondly, a low dark current is essential to maintain a high dynamic range (HDR), reduce dark signal non-uniformity (DSNU) noise and reduce dark signal shot noise, due to a fact that the operation temperature of the automobile is commonly higher than other applications such as the cell phone camera.

Thirdly, low blooming is an indispensable requirement, especially at night, for a road scene that is usually high dynamic range type. The CMOS image sensor is required to have a good blooming control at ultra-bright region in order to ensure its neighboring dimly lit regions are not washed out by blooming charges from the ultra-bright region. With respect to certain high dynamic range scheme, in which photodiode (PD) integrations are different, the blooming of a longer integration PD could destroy the information in a shorter integration PD.

Fourthly, red information is particularly important in the automobile application as tail lights of the automobiles and traffic light have a strong red component. Moreover, the image sensor is even required to collect infrared (IR) and near-infrared (NIR) information outside the visible light spectrum for better decision making.

In the conventional CMOS image sensor, a signal is represented by electrons in each pixel, and all transistors used in the pixel are n-type metal-oxide-semiconductor (NMOS) transistors. The holes and electrons generated from absorbed photons are stored on p-type side and n-type side, respectively, of a photodiode in the pixel. After exposure, only the electrons are transferred via an NMOS transfer gate to an n-type floating diffusion (FD) node, where the electrons are converted to a voltage signal by an FD junction capacitor. The voltage signal is then relayed by subsequent circuit as an output of the pixel.

In order to improve the dark current and the blooming issues mentioned above, a hole-based photodiode, as shown in FIG. 1, is disclosed, for example, in a disclosure entitled "Low-Crosstalk and Low-Dark-Current CMOS Image-Sensor technology Using a Hole-Based Detector," Digest of 2008 IEEE International Solid-State Circuits Conference, 60-61, by Eric Stevens, et al., the disclosure of which is hereby incorporated by reference.

The hole-based photodiode shown in FIG. 1 suppresses more dark current than the conventional electron-based CMOS image sensor. Specifically speaking, the bulk dark current may be branched out by a p-type substrate 10, which acts as blooming holes drain. Further, the dark current could be substantially reduced at the $Si/SiO_2$ interface, for example, between a shallow trench isolation (STI) 12 and an N+ well 14, due to dopant aggregation, compared to dopant segregation at the same interface in the electron-based CMOS image sensor. Moreover, as the mobility of hole is much lower than that of electron, drift and diffusion current in the hole-based CMOS image sensor under a same electrical field and charge distribution are much smaller than the electron-based CMOS image sensor. Furthermore, the grounded p-type substrate 10 is a low potential drain to holes bloomed from the hole-based PD, so it provides a good blooming control, which is desirable for auto applications.

However, the depth of a p-type photodiode 16 in the hole-based CMOS image sensor is limited by the implanted depth of an N well 18 because of heavier n-type dopants compared with p-type dopants. For example, atomic mass of n-type Phosphorus is 30.97 or Arsenic is 74.92, while p-type Boron is 10.81. The shallow p-type photodiode 16, accordingly, cannot collect substantial electron-hole pairs to cover red/NIR absorption region. On the other hand, for the PD 16 with a given depth, the depth of the N well 18 is limited by crosstalk and blooming control. If it is too deep, diffusion charges will go to the neighboring pixels instead of being collected by the p-type PD.

For the foregoing reasons, a need has arisen to propose a novel CMOS image sensor that has improved red/NIR response and maintain the good blooming and crosstalk controls in FIG. 1.

SUMMARY OF THE INVENTION

In view of the foregoing, it is an object of the embodiment of the present invention to provide a structure and a process of a hole-based ultra-deep photodiode in CMOS image sensor that has improved red/NIR response, reduced crosstalk, blooming and lowered dark current.

According to one embodiment of the present invention, the hole-based ultra-deep photodiode in a CMOS image sensor includes a p-type substrate, an n-type epitaxial layer and an ultra-deep p-type photodiode implant region. The p-type substrate is grounded or connected to a negative power supply. The n-type epitaxial layer is grown on the p-type substrate, and is connected to a positive power supply. The deep p-type photodiode implant region is formed in the n-type epitaxial layer.

DETAILED DESCRIPTION OF THE INVENTION

Figure 1:
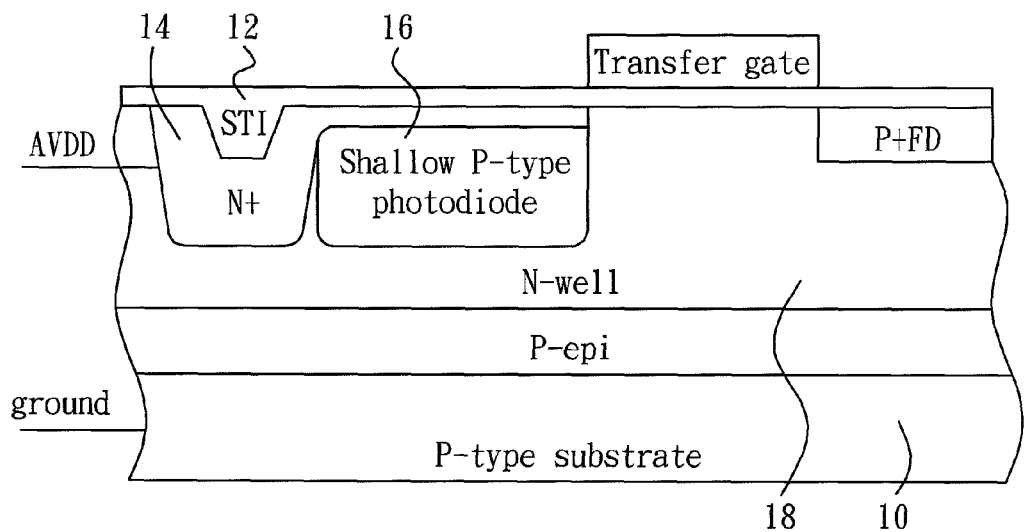
FIG. 1 shows a cross section of a hole-based photodiode in a conventional CMOS image sensor.
Figure 2:
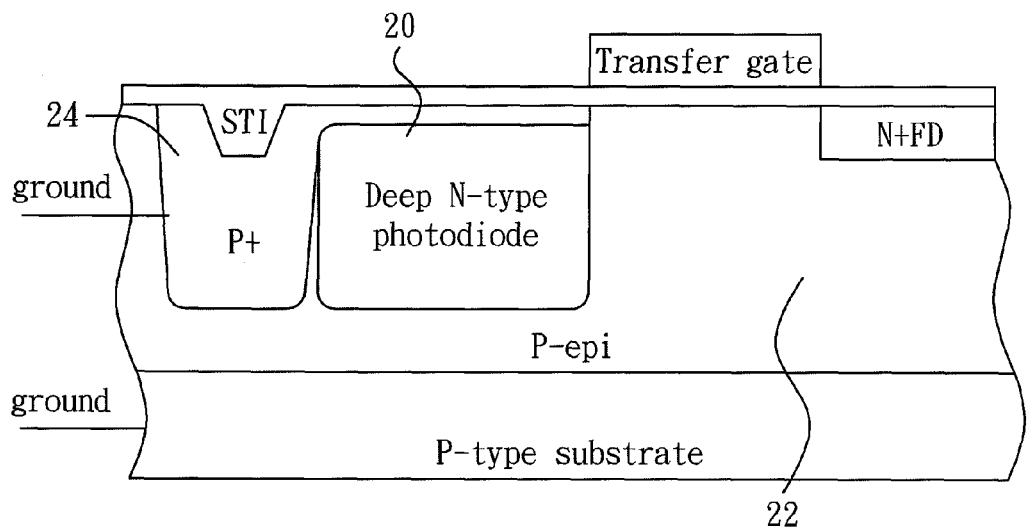
FIG. 2 shows a cross section of an electron-based deep photodiode.

In order to enhance long wavelength such as red/NIR response and reduce the diffusion crosstalk, an electron-based photodiode is illustrated in FIG. 2, which has a deep n-type photodiode 20 capable of substantially collecting electron-hole pairs to cover red/NIR absorption region and collect more signals. Moreover, the diffusion charges in a p-type epitaxial layer (Epi) 22 under the deep n-type photodiode 20 are significantly reduced; therefore the amount of the diffusion charges going to neighboring pixels is reduced. While in FIG. 1, the low crosstalk brought by the blooming drain comes with the penalty of low Red/NIR response. However, in FIG. 2, there is no blooming drain as in FIG. 1.

Figure 3:
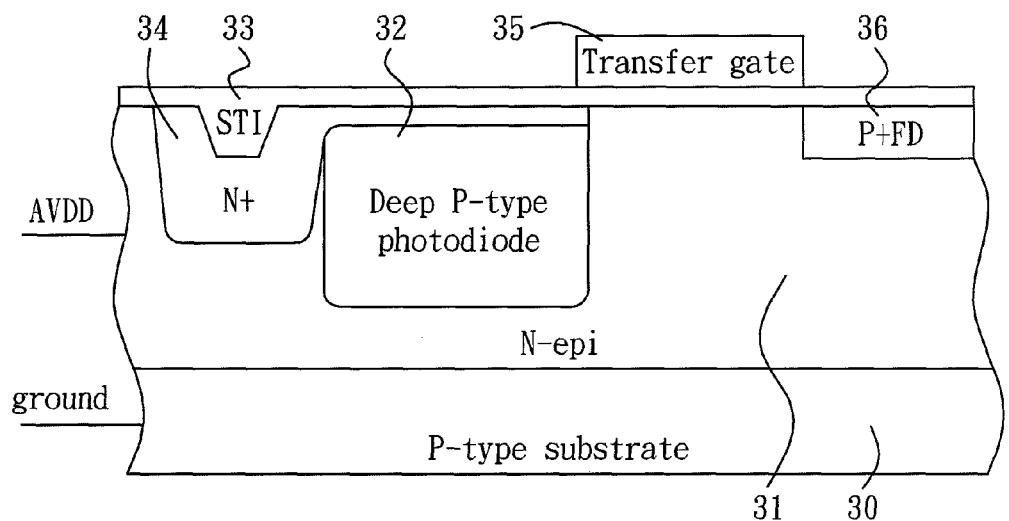
FIG. 3 shows a cross section of a hole-based ultra-deep photodiode in a CMOS image sensor according to an embodiment of the present invention.

To take advantages of both FIGS. 1 & 2, FIG. 3 shows a cross section of a hole-based ultra-deep photodiode in a CMOS image sensor according to an embodiment of the present invention. A simplified diagram is shown here to illustrate primary constituent parts, while a detailed structure is shown in FIG. 4C. In the embodiment, the term "deep" or "ultra-deep" refers to a depth above 0.5 µm, for example, 0.5-2 µm, and preferably refers to a depth above 2 µm. The disclosed photodiode may be adaptable to a severe environment such as, but not limited to, an automobile application. As the hole-based photodiode inherently achieves lower dark current as discussed above in association with FIG. 1, the disclosed photodiode thus can meet stringent temperature requirement of the automobile application.

In the embodiment, same as FIG. 1, a p-type substrate 30 is grounded or connected to a negative power supply. The p-type substrate 30 is used as blooming holes drain that is favorable to high dynamic range (HDR) scene at night. At a normal operation, the p-type substrate 30 could reduce crosstalk for red/NIR signals. More details about anti-blooming control may be referred to following disclosures, which is hereby incorporated by reference: "Interline CCD Image Sensor with an Antiblooming Structure," IEEE Transactions on Electron Devices, Vol. ED-31, No. 1, January 1984, by Yasuo Ishihara, et el.; "Super Small, Sub 2 µm Pixels For Novel CMOS Image Sensors," International Image Sensor Workshop, Jun. 7-10, 2007, Ogunquit, Me. USA, by G. Agranov, et al.

An n-type epitaxial layer 31 is grown on the p-type substrate 30, and is connected to a positive power supply AVDD. A deep p-type photodiode implant region 32 is formed in the n-type epitaxial layer 31. As the n-type epitaxial layer 31 (rather than an N well 18 (FIG. 1)) is used, it is not subject to the implant depth limitation of heavy n-type dopants. Due to the lighter p-type dopants, the deep p-type photodiode implant region 32 can be made deeper such that the signal-to-noise ratio (SNR) and red/NIR response may be substantially improved, compared with the conventional electron-based photodiode.

An isolation such as a shallow trench isolation (STI) 33 is formed in the n-type epitaxial layer 31. A cell isolation (N+) 34 is formed surrounding the sides and bottom of the STI 33. Still due to the heavier n-type dopants, the thermal diffusion in the n-type isolation layer 34 could be substantially reduced compared to the p-type isolation layer 24 shown in FIG. 2. Therefore, more compact isolation is formed, and more rooms are freed for the photodiode 32. As a result, the signal collection and crosstalk are substantially improved.

A transfer gate 35 is formed on the n-type epitaxial layer 31, and is disposed between the deep p-type photodiode implant region 32 and a p-type floating diffusion (P+FD) implant region 36.

Figure 4A:
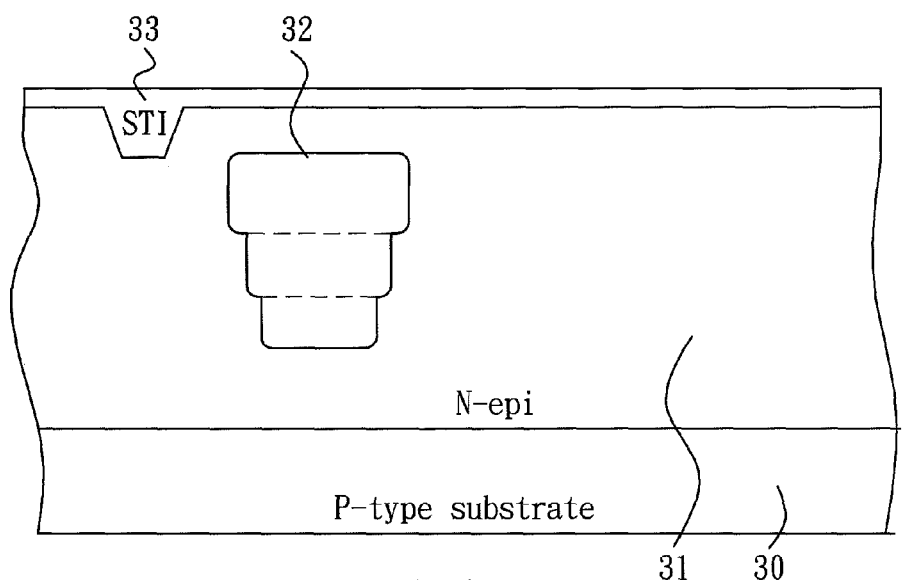
FIG. 4A through FIG. 4C show cross sections illustrative of a process of manufacturing a hole-based ultra-deep photodiode in a CMOS image sensor according to the embodiment of the present invention.
Figure 4B:
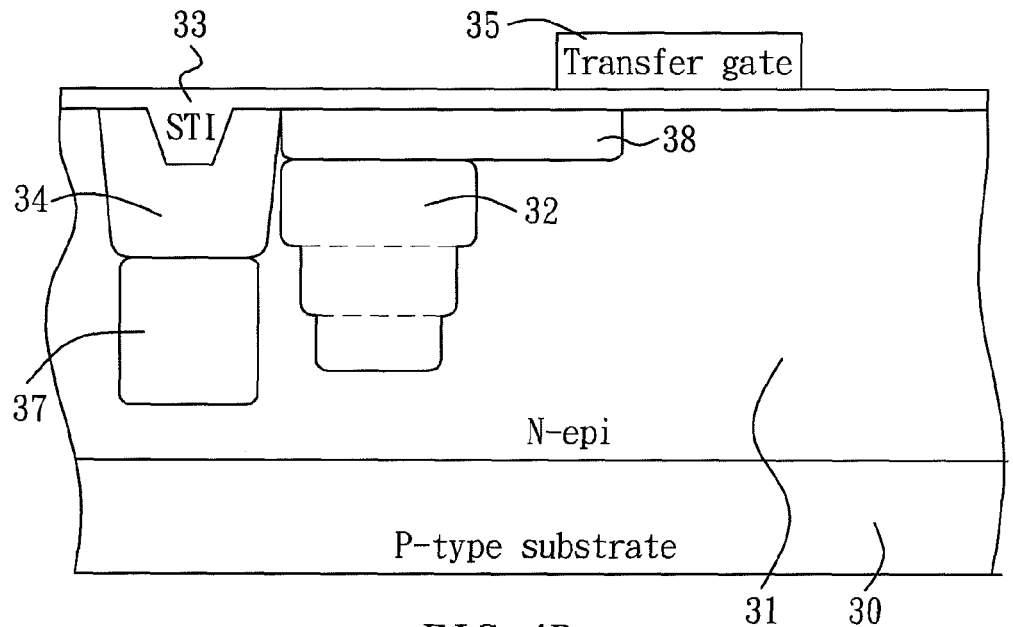
Figure 4C:
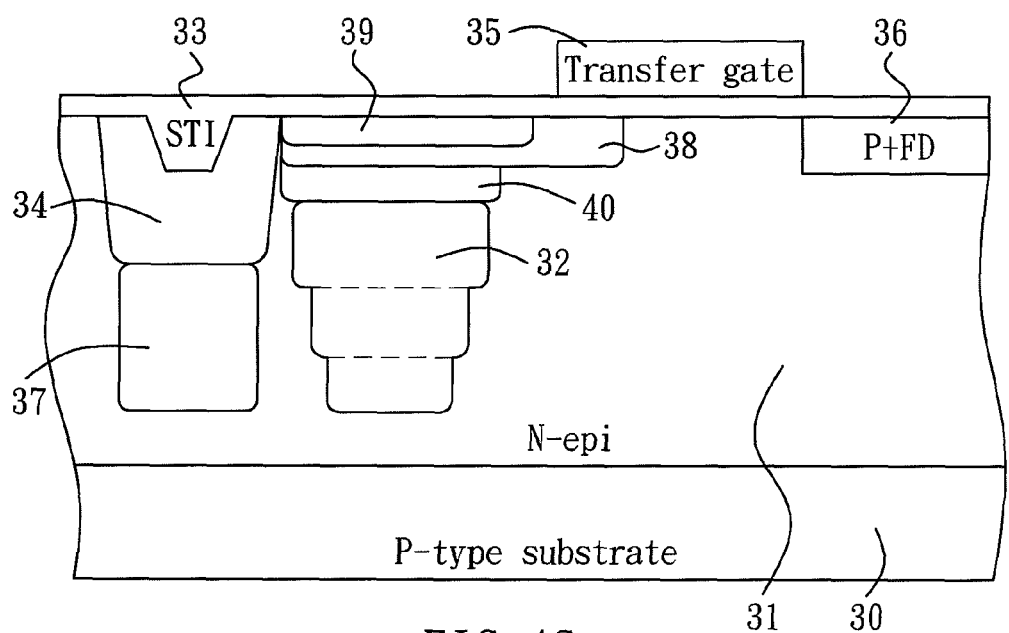

FIG. 4A through FIG. 4C show cross sections illustrative of a process of manufacturing a hole-based ultra-deep photodiode in a CMOS image sensor according to the embodiment of the present invention. Constituent parts or regions being the same as those in FIG. 3 are denoted with the same numerals. The following illustrated steps may be performed based on conventional semiconductor process technologies, and their details are thus omitted for brevity.

In FIG. 4A, the p-type substrate ("substrate" for short) 30 is provided, and the n-type epitaxial layer ("epitaxial layer" for short) 31 is then grown on the substrate 30. In the embodiment, the epitaxial layer 31 has a thickness of, but not limited to, 6 µm or more.

Subsequently, still referring to FIG. 4A, deep p-type photodiode implant is performed a number of times to form the deep p-type photodiode implant region ("photodiode implant region" for short) 32. The implant is performed in an area defined by a mask (not shown). Each implant is done with different energy to achieve the required profile. Further, a thermal treatment may be applied, for example, after each implant steps, to smooth out the profile. Or, the profile can just rely on the thermal treatments from subsequent process steps. The isolation such as the STI 33 is then formed in the epitaxial layer 31.

In FIG. 4B, the cell isolation (or cell N well) 34 is implanted surrounding the sides and bottom of the STI 33, and a deep isolation (or deep N well) 37 is implanted below the cell isolation 34. Further, a n-type channel implant region 38 is implanted in a top surficial region of the epitaxial layer 31, and is disposed above the photodiode implant region 32. It is appreciated that the cell isolation 34, the deep isolation 37 and the channel implant region 38 may be formed in a proper sequence. Afterwards, the transfer gate 35 is formed on the epitaxial layer 31.

In FIG. 4C, a pinning implant region 39 is implanted in a top surficial region of the epitaxial layer 31. In the embodiment, the n-type pinning implant region 39 is disposed within the channel implant region 38. A surface p-type implant region 40 is implanted as the main hole-based PD between the channel implant region 38 and the deep photodiode implant region 32. The pinning implant region 39 and the channel implant region 38 are primarily used, in the embodiment, to suppress the dark current and optimize the transfer gate. It is appreciated that the pinning implant region 39 and the surface PD implant region 40 may be formed in a proper sequence. Afterwards, the p-type floating diffusion (FD) implant region 36 is implanted.

Although specific embodiments have been illustrated and described, it will be appreciated by those skilled in the art that various modifications may be made without departing from the scope of the present invention, which is intended to be limited solely by the appended claims.

What is claimed is:

1. A hole-based ultra-deep photodiode in a CMOS image sensor, comprising:
    a p-type substrate being grounded or connected to a negative power supply;
    an n-type epitaxial layer grown on the p-type substrate, the n-type epitaxial layer being directly connected to a positive power supply; and
    an ultra-deep p-type photodiode implant region formed in the n-type epitaxial layer.

2. The photodiode of claim 1, wherein the ultra-deep p-type photodiode implant region has a thickness above 0.5µm.

3. The photodiode of claim 2, wherein the ultra-deep p-type photodiode implant region has the thickness of 0.5-2µm.

4. The photodiode of claim 2, wherein the ultra-deep p-type photodiode implant region has the thickness above 2µm.

5. The photodiode of claim 1, further comprising:
    an isolation formed in the n-type epitaxial layer.

6. The photodiode of claim 5, wherein the isolation is a shallow trench isolation (STI).

7. The photodiode of claim 5, further comprising:
an n-type cell isolation formed surrounding sides and a bottom of the isolation.

8. A process of manufacturing a hole-based ultra-deep photodiode in a CMOS image sensor, comprising;
providing a p-type substrate;
growing an n-type epitaxial layer on the p-type substrate; and
forming an ultra-deep p-type photodiode implant region in the n-type epitaxial layer, wherein the ultra-deep p-type photodiode implant region is formed by performing implant a number of times with different energies.

9. The process of claim 7, further comprising:
applying a thermal treatment after each said implant and/or taking advantage of thermal treatments of subsequent process steps.

10. The process of claim 7, further comprising:
forming an isolation in the n-type epitaxial layer.

11. The process of claim 10, further comprising:
implanting an n-type cell isolation surrounding sides and a bottom of the isolation; and
implanting an n-type deep isolation below the cell isolation.

12. The process of claim 7, further comprising:
implanting a channel implant region in a top surficial region of the n-type epitaxial layer, wherein the channel implant region is disposed above the deep p-type photodiode implant region.

13. The process of claim 12, further comprising:
implanting an n-type pinning implant region in a top surficial region of the n-type epitaxial layer; and
implanting a p-type surface implant region as a main hole-based photodiode (PD) for charge storage in the n-type epitaxial layer, wherein the surface implant region is disposed between the channel implant region and the deep p-type photodiode implant region.

14. The process of claim 7, further comprising:
forming a transfer gate on the n-type epitaxial layer; and
forming a p-type floating diffusion (FD) implant region in the n-type epitaxial layer, wherein the transfer gate is disposed between the ultra-deep p-type photodiode implant region and the p-type floating diffusion implant region.

15. The process of claim 7, wherein the ultra-deep p-type photodiode implant region has a thickness above 0.5 μm.

16. The process of claim 15, wherein the ultra-deep p-type photodiode implant region has the thickness of 0.5-2 μm.

17. The process of claim 15, wherein the ultra-deep p-type photodiode implant region has the thickness above 2 μm.

* * * * *